US008212581B2

(12) United States Patent
Levey et al.

(10) Patent No.: US 8,212,581 B2
(45) Date of Patent: Jul. 3, 2012

(54) DEFECTIVE EMITTER DETECTION FOR ELECTROLUMINESCENT DISPLAY

(75) Inventors: Charles I. Levey, West Henrietta, NY (US); Felipe A. Leon, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 378 days.

(21) Appl. No.: 12/570,239

(22) Filed: Sep. 30, 2009

(65) Prior Publication Data

US 2011/0074429 A1 Mar. 31, 2011

(51) Int. Cl.
*G01R 31/26* (2006.01)
*G09G 3/30* (2006.01)

(52) U.S. Cl. ................ 324/760.01; 324/760.02; 345/76; 345/82; 345/90; 315/169.3; 313/463

(58) Field of Classification Search ......... 324/760.01–760.02, 414; 345/76–93; 315/169.3; 313/463
See application file for complete search history.

(56) References Cited

U.S. PATENT DOCUMENTS

| | | | | |
|---|---|---|---|---|
| 6,965,395 | B1 | 11/2005 | Neter | |
| 7,474,115 | B1 | 1/2009 | Trujillo et al. | |
| 7,696,773 | B2 * | 4/2010 | Levey | 324/760.01 |
| 7,859,501 | B2 * | 12/2010 | Levey et al. | 345/90 |
| 8,130,182 | B2 * | 3/2012 | Levey et al. | 345/78 |
| 2002/0014851 | A1 | 2/2002 | Tai et al. | |
| 2006/0164407 | A1 | 7/2006 | Cok | |
| 2006/0256048 | A1 | 11/2006 | Fish et al. | |
| 2007/0126460 | A1 | 6/2007 | Chung et al. | |
| 2008/0218451 | A1 | 9/2008 | Miyamoto et al. | |
| 2008/0315788 | A1 | 12/2008 | Levey et al. | |
| 2009/0027377 | A1 * | 1/2009 | Kwon | 345/214 |
| 2009/0295422 | A1 * | 12/2009 | Hamer et al. | 324/769 |

* cited by examiner

*Primary Examiner* — Jermele M Hollington
*Assistant Examiner* — Emily Chan
(74) *Attorney, Agent, or Firm* — Morgan, Lewis & Bockius LLP

(57) ABSTRACT

Inoperative or defective electroluminescent (EL) emitters in an EL display having a plurality of subpixels are detected. Current flow through a drive transistor in a subpixel is turned off, a selected test current is provided through the EL emitter in the subpixel using a current source, and the voltage at a second electrode of a readout transistor in the subpixel is measured to provide a status signal representative or characteristics of the selected EL emitter. The status signal for the subpixel is compared to the respective status signals of neighboring subpixels to determine whether the EL emitter in the subpixel is defective.

14 Claims, 6 Drawing Sheets

DEFECTIVE EMITTER DETECTION FOR ELECTROLUMINESCENT DISPLAY

CROSS REFERENCE TO RELATED APPLICATIONS

Reference is made to commonly-assigned, co-pending U.S. patent application Ser. No. 11/766,823 filed Jun. 22, 2007, entitled "OLED DISPLAY WITH AGING AND EFFICIENCY COMPENSATION" to Levey et al., to U.S. patent application Ser. No. 12/258,388 filed Oct. 25, 2008, entitled "ELECTROLUMINESCENT DISPLAY WITH INITIAL NONUNIFORMITY COMPENSATION" to Levey et al., and to U.S. patent application Ser. No. 12/260,103 filed Oct. 29, 2008, entitled "ELECTROLUMINESCENT DISPLAY WITH EFFICIENCY COMPENSATION" to Leon, the disclosures of which are incorporated herein.

FIELD OF THE INVENTION

The present invention relates to detection of defective subpixels in an electroluminescent display.

BACKGROUND OF THE INVENTION

Flat-panel displays are of great interest as information displays for computing, entertainment, and communications. For example, electroluminescent (EL) emitters have been known for some years and have recently been used in commercial display devices. Such displays typically employ a plurality of subpixels disposed over a display substrate. Each subpixel contains an EL emitter and, in active-matrix control schemes, a drive transistor for driving current through the EL emitter. The subpixels are typically arranged in two-dimensional arrays with a row and a column address for each subpixel, and having a data value associated with the subpixel. Single EL subpixels can also be employed for lighting and user-interface applications. EL subpixels can be made using various emitter technologies, including coatable-inorganic light-emitting diode, quantum-dot, and organic light-emitting diode (OLED). A typical EL subpixel includes an anode, one or more light-emitting layers, and a cathode.

However, EL emitters suffer from faults that can render an emitter defective, causing so-called "dim dots," which do not emit as much light for a given drive current or voltage as their neighbors, or "dead dots," which emit substantially no light. For example, shorts between the anode and cathode of an emitter can provide current paths that bypass the light-emitting layers. Moisture ingress into the light-emitting layers can damage or destroy the light-emitting properties of those layers. Manufacturing faults in the substrate or drive transistor can damage or open the connection between the drive transistor and the EL emitter. Detection of dim or dead dots is an important step in the manufacturing process, both to avoid shipping defective panels and to provide opportunities to compensate for the detected dim or dead dots, and continues to be important as faults develop over the life of a display.

Various schemes compensate for image variation due to defective emitters. For example, US Patent Application Publication No. 2007/0126460 to Chung et al. describes inspecting a panel during fabrication to determine the location of defects and electrically connecting a normal pixel to the defective pixel to compensate. However, this scheme is expensive and time-consuming. It requires laser-welding adjacent EL emitters together, which degrades image quality. Moreover, it cannot compensate for failures due to moisture ingress, which occur periodically over the life of the display.

Commonly-assigned US Patent Application Publication No 2006/0164407 to Cok teaches various methods for compensating for defective subpixels. However, this disclosure teaches measuring the light output of each subpixel to determine which subpixels are defective. This is very difficult to do except in controlled manufacturing conditions. Therefore, failures over the life of the display can only be compensated for by special equipment duplicating those manufacturing conditions.

U.S. Pat. No. 7,474,115 to Trujillo et al. teaches measuring a display device using an infrared camera and suffers from the same limitations as the disclosure of Cok.

US Patent Application Publication No. 2006/0256048 to Fish et al. teaches using a photodiode in each subpixel to measure the light output of the subpixel and compensate for variations in the emitter. However, this scheme requires a very complex subpixel circuit, reducing the area available to emit light and therefore increasing the power and reducing the lifetime of a display, and reducing the manufacturing yield of functional displays.

U.S. Pat. No. 6,965,395 to Neter teaches various ways of compensating for defective pixels in a CCD or CMOS image sensor. However, this method relies on filtering incoming sensed data, and therefore requires the incoming data not have high-frequency, high-amplitude edges that can be confounded with defects. However, such edges are common in display applications, and are found, for example, at the edges of characters in the display of a word processing program, or at the edge of a ticker at the bottom of the screen on a television program.

There is a continuing need, therefore, for a method for detecting defective pixels over the life of an electroluminescent display which is optimized for use in displays and does not require complex equipment or display electronics.

SUMMARY OF THE INVENTION

In accordance with an aspect of the present invention, there is provided a method of detecting defective electroluminescent (EL) emitters in an EL display, comprising:

a) providing the EL display having a plurality of subpixels, each including a drive transistor, a readout transistor and an EL emitter, the drive transistor having an electrode connected to an electrode of the EL emitter and to a first electrode of the readout transistor;

b) selecting a subpixel;

c) turning off current flow through the drive transistor in the selected subpixel;

d) providing a selected test current through the EL emitter in the selected subpixel using a current source;

e) measuring the voltage at a second electrode of the readout transistor in the selected subpixel to provide a status signal representative of characteristics of the EL emitter in the selected subpixel; and f) comparing the status signal for the selected subpixel to the respective status signals of at least two neighboring subpixels to determine whether the EL emitter in the selected subpixel is defective.

In accordance with another aspect of the present invention, there is provided a method of detecting defective electroluminescent (EL) emitters in an EL display, comprising:

a) providing the electroluminescent (EL) display having a plurality of subpixels, each having an EL emitter with a first and a second electrode, a drive transistor with a first electrode, a second electrode connected to the first electrode of the EL emitter, and a gate electrode, and a readout transistor with a first electrode connected to the second electrode of the drive transistor, a second electrode and a gate electrode;

b) providing a first voltage source associated with the first electrode of the drive transistor in each of the plurality of subpixels;

c) providing a second voltage source connected to the second electrode of the EL emitter in each of the plurality of subpixels;

d) providing a current source associated with the second electrode of the readout transistor;

e) selecting an EL subpixel and its corresponding drive transistor, readout transistor and EL emitter;

f) providing a voltage measurement circuit associated with the second electrode of the selected readout transistor;

g) turning off current flow through the selected drive transistor:

h) providing a selected test current through the EL emitter using the current source:

i) measuring the voltage at the second electrode of the selected readout transistor using the voltage measurement circuit to provide a corresponding status signal representative of characteristics of the selected EL emitter;

j) repeating steps e through i for each remaining EL subpixel in the plurality of EL subpixels;

k) selecting an EL subpixel;

l) selecting a subpixel neighborhood for the selected EL subpixel, wherein the subpixel neighborhood includes at least two subpixels adjacent to the selected EL subpixel;

m) comparing the status signal for the selected EL subpixel to the respective status signals of each of the subpixels in the selected subpixel neighborhood to determine whether the selected EL emitter is defective; and n) repeating steps k through m for each remaining EL subpixel in the plurality of EL subpixels to detect other defective EL emitters in the EL display.

The present invention provides a simple and effective way of detecting subpixel failures over the life of a display, including failures not present when the display is made. It does not require special test equipment or conditions. It does not have a significant effect on the power consumption, lifetime or other performance attributes of the display. It is optimized for use in displays, so its results are not corrupted by displayed image data. By averaging subpixels, it has reduced vulnerability to dead or dim subpixels adjacent to a subpixel under test.

DETAILED DESCRIPTION OF THE INVENTION

Figure 1:
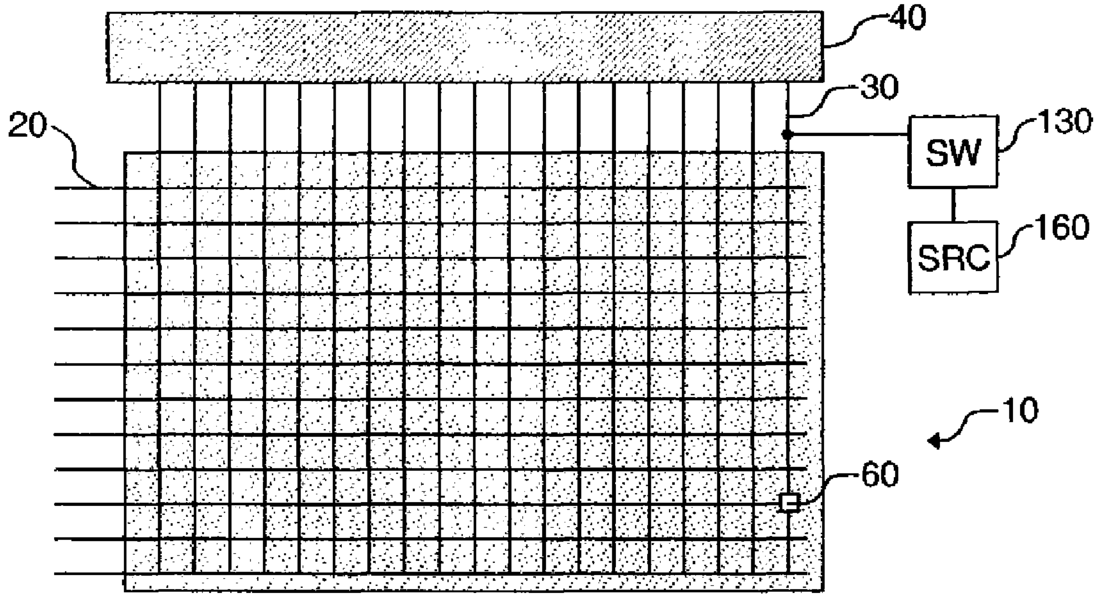
FIG. 1 is a schematic diagram of an embodiment of an electroluminescent (EL) display according to the present invention.

Turning now to FIG. 1, there is shown a schematic diagram of one embodiment of an electroluminescent (EL) display that useful in detecting defective EL emitters according to the present invention. EL display 10 includes an array of a plurality of EL subpixels 60 arranged in rows and columns. Note that the rows and the columns can be oriented differently than shown here; for example, they can be rotated ninety degrees. EL display 10 includes a plurality of select lines 20 wherein each row of EL subpixels 60 has a select line 20. EL display 10 includes a plurality of readout lines 30 wherein each column of EL subpixels 60 has a readout line 30. Each readout line 30 is connected to second switch 130, which connects readout line 30 to current source 160 during a measurement process described below. Although not shown for clarity of illustration, each column of EL subpixels 60 also has a data line as well-known in the art. The plurality of readout lines 30 is connected to one or more multiplexers 40, which permits parallel/sequential readout of signals from EL subpixels, described below. Multiplexer 40 can be a part of the same structure as EL display 10, or can be a separate construction that can be connected to or disconnected from EL display 10.

Figure 2A:
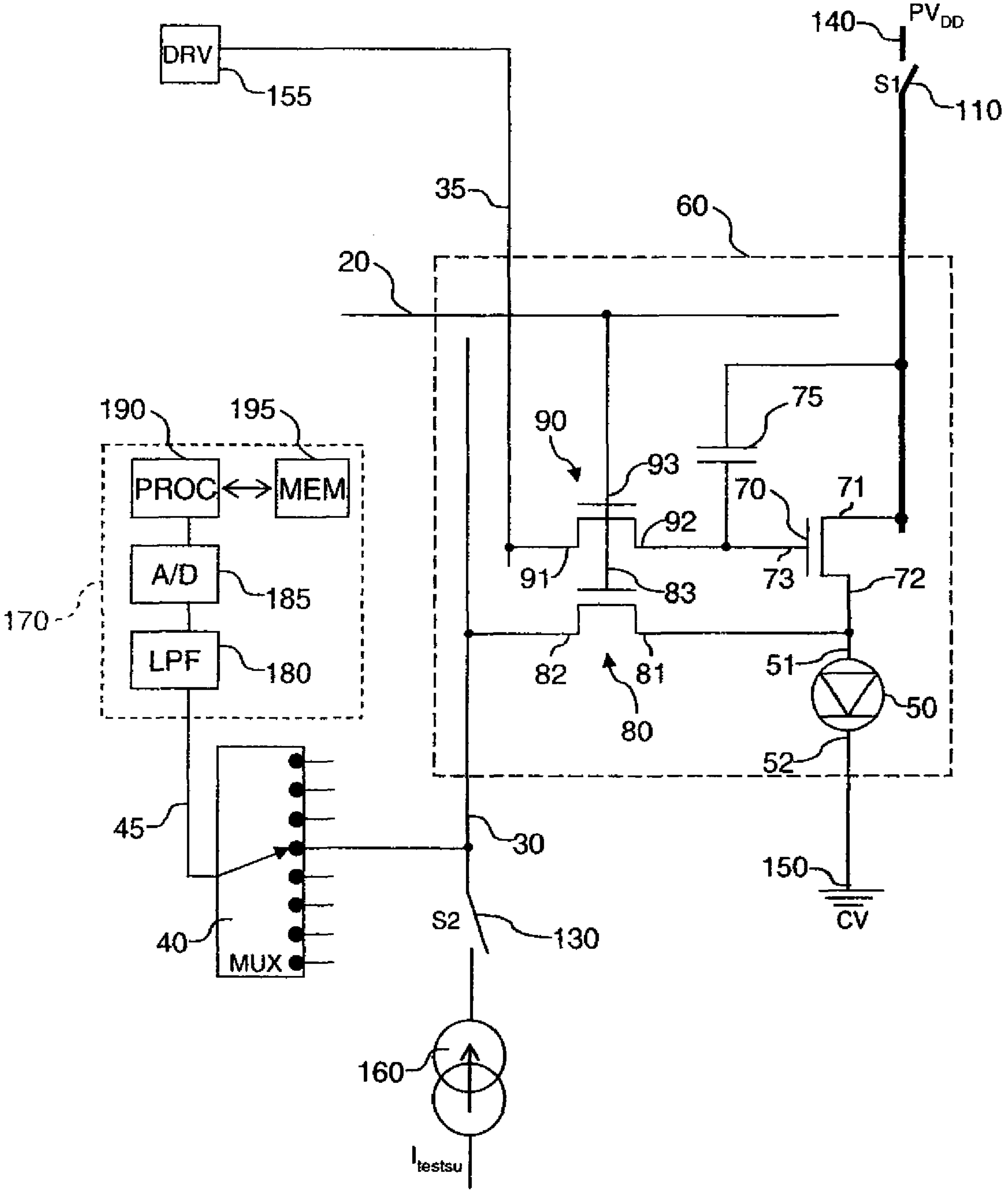
FIG. 2A is a schematic diagram of an embodiment of an EL subpixel and associated circuitry useful with the present invention.

Turning now to FIG. 2A, there is shown a schematic diagram of one embodiment of an EL subpixel and associated circuitry useful with the present invention. EL subpixel 60 includes EL emitter 50, drive transistor 70, capacitor 75, readout transistor 80, and select transistor 90. EL emitter 50 has a first electrode 51 and a second electrode 52. Drive transistor 70 has first electrode 71, second electrode 72, and gate electrode 73. Readout transistor 80 has first electrode 81, second electrode 82, and gate electrode 83. Select transistor 90 has first electrode 91, second electrode 92, and gate electrode 93.

The gate electrode 73 of drive transistor 70 is connected to second electrode 92 of select transistor 90 to selectively provide data from source driver 155 via data line 35 to drive transistor 70 as well known in the art. Data line 35 is connected to first electrode 91 of select transistor 90. Select line 20 is connected to the gate electrodes 93 of the select transistors 90 in the row of EL subpixels 60. The gate electrode 93 of select transistor 90 is connected to the gate electrode 83 of readout transistor 80.

The first electrode 81 of readout transistor 80 is connected to the second electrode 72 of drive transistor 70 and to the first electrode 51 of EL emitter 50. Second electrode 72 of drive transistor 70 is connected to first electrode 51 of EL emitter 50.

A first voltage source 140 can be selectively connected to first electrode 71 of drive transistor 70 by optional first switch 110, which can be located on the EL display substrate (not shown; glass or other rigid or flexible substrate known in the art) or on a separate structure. By connected, it is meant that the elements are directly connected or electrically connected via another component, e.g. a switch, a diode, or another transistor. Second voltage source 150 is connected to second electrode 52 of EL emitter 50. At least one first switch 110 is preferably provided for the EL display. Additional first switches can be provided if the EL display has multiple powered subgroupings of pixels. In normal display mode, the first switch is closed and the second switch (described below) is open.

The readout line 30 is connected to the second electrodes 82 of the readout transistors 80 in a column of subpixels 60. Readout line 30 is connected to second switch 130. One second switch 130 is provided for each column of EL subpixels 60. The second switch 130 permits a current source 160 to be selectively connected to the second electrode 82 of readout transistor 80, which, when connected, permits a selected constant current to flow into EL subpixel 60. Second switch 130 and current source 160 can be located on or off the display substrate.

In an EL display 10 including a plurality of EL subpixels 60, a single current source 160 can be selectively connected through the second switch to the second electrode 82 of each readout transistor 80 in the plurality of EL subpixels 60. More than one current source 160 can be used provided the second electrode 82 of each readout transistor 80 is selectively connected to either one current source or nothing at any given time.

The second electrode of readout transistor 80 is also connected to voltage measurement circuit 170, which measures voltages to provide status signals representative of characteristics of EL emitter 50 in EL subpixel 60. Voltage measurement circuit 170 includes analog-to-digital converter 185, for converting voltage measurements into digital signals, and processor 190. The signal from analog-to-digital converter 185 is sent to processor 190. Voltage measurement circuit 170 can also include memory 195 for storing status signals or a low-pass filter 180 for attenuating high-frequency noise in the voltage measurements. Voltage measurement circuit 170 can be connected directly to a readout line 30, or through multiplexer output line 45 and multiplexer 40 to a plurality of readout lines 30 and readout transistors 80 for sequentially reading out the voltages from a predetermined number of EL subpixels 60. If there are a plurality of multiplexers 40, each can have its own multiplexer output line 45. Thus, a predetermined number of EL subpixels can be driven simultaneously. The plurality of multiplexers permits parallel reading out of the voltages from the various multiplexers 40, and each multiplexer permits sequential reading out of the readout lines 30 attached to it. This is referred to herein as a parallel/sequential process.

Figure 2B:
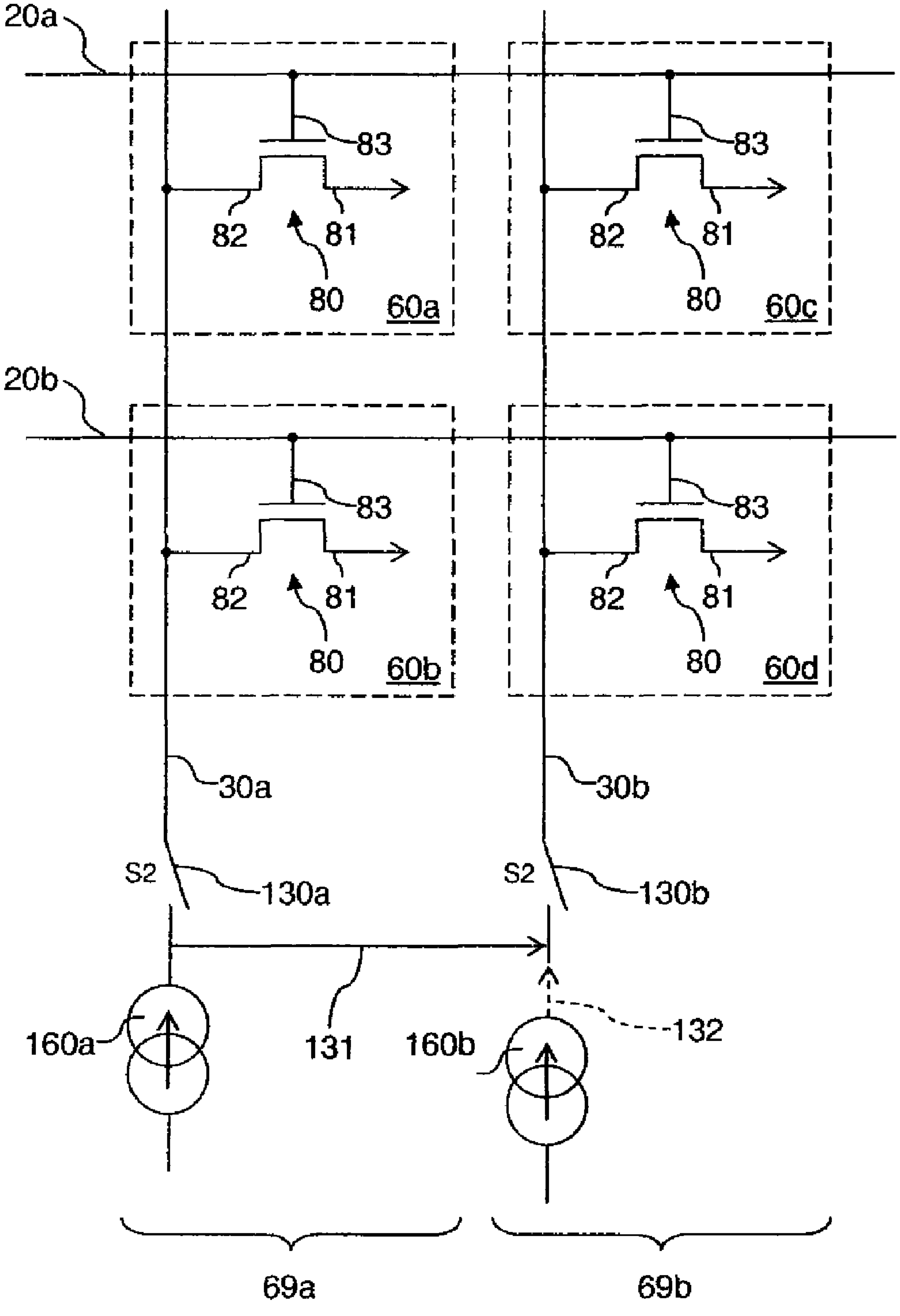
FIG. 2B is a schematic diagram of subpixel groups according to an embodiment of the present invention.

Referring to FIG. 2B, in an embodiment of the invention, the plurality of subpixels is divided into one or more subpixel group(s). For clarity in this figure, there is shown for each subpixel 60*a*, 60*b*, 60*c*, 60*d* only readout transistor 80 with first electrode 81, second electrode 82 and gate electrode 83. All other components of subpixels 60*a*, 60*b*, 60*c*, 60*d* are as shown on FIG. 1A. Select lines 20*a* and 20*b* are as shown on FIGS. 1 and 2A.

In one embodiment, each subpixel group can include one column of subpixels. Subpixels 60*a* and 60*b* form subpixel group 69*a*. Subpixels 60*c* and 60*d* form subpixel group 69*b*. Each subpixel group has a respective second switch for selectively connecting the current source to the second electrode of the readout transistor in each of the plurality of subpixels in the respective subpixel group. Subpixel group 69*a* has readout line 30*a* and second switch 130*a*. Subpixel group 69*b* has readout line 30*b* and second switch 130*b*. Subpixel group 69*b* is connected through second switch 130*b* and connection 131 to current source 160*a*. Alternatively, subpixel group 69*b* can be connected through second switch 130*b* and connection 132 to its own current source 160*b*.

Figure 3:
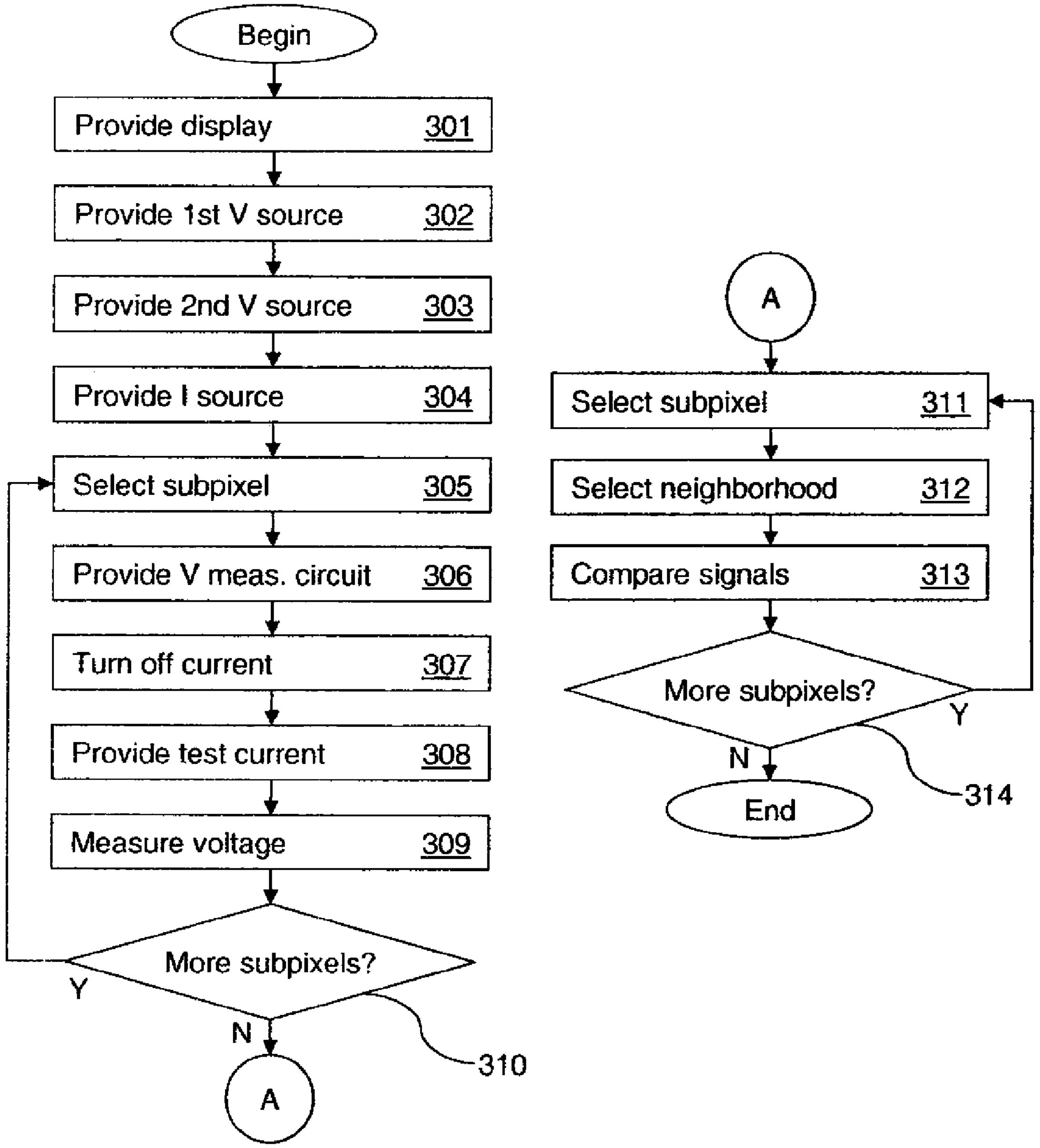
FIG. 3 is a flowchart of a method of detecting defective EL emitters in an EL display according to an embodiment of the present invention.

Referring now to FIG. 3, and also to FIGS. 1, 2A, and 2B, a method of detecting defective (dim or dead) electroluminescent (EL) emitters in an EL display according to an embodiment of the present invention includes providing the apparatus described above: EL display 10 (step 301), first voltage source 140 and optionally first switch 110 for connecting first voltage source 140 to first electrode 71 of drive transistor 70 in each of the plurality of subpixels (step 302), second voltage source 150 (step 303), and current source 160 (step 304). A measurement process then begins. An EL subpixel 60 of a selected plurality of EL subpixels, and its corresponding drive transistor 70, readout transistor 80 and emitter 50, are selected for measurement (step 305). Selecting the readout transistor 80 includes applying a gate voltage to the readout transistor 80 to cause it to conduct (e.g. 25VDC for an N-channel readout transistor). A voltage measurement circuit 170 associated with or connected to the second electrode of the selected readout transistor 80 is provided (step 306). Current flow through the selected drive transistor is turned off (step 307). This can be accomplished, for example, by opening first switch 110, or by applying a negative (for N-channel) gate voltage ($V_g$) to gate electrode 73 of drive transistor 70. When current flow is turned off, substantially zero current flows through the drive transistor.

A selected test current is then provided through the EL emitter using the current source (step 308). This test current produces a voltage across EL emitter 50. The voltage at first electrode 51 of EL emitter 50 is carried through first electrode 81 and second electrode 82 of readout transistor 80 to readout line 30, and thence to voltage measurement circuit 170. Voltage measurement circuit 170 then measures the voltage (step 309) to provide a status signal corresponding to the selected subpixel 60 representative of characteristics of the selected EL emitter, and stores the status signal in memory 195. If there are other subpixels to be measured (decision step 310), the selected subpixel 60 and components are de-selected, including applying a gate voltage to the readout transistor 80 to cause it not to conduct, and another subpixel is selected and measured. Measurements can be taken of all subpixels 60 on EL display 10, all subpixels of a particular color, a subset of subpixels on EL display 10 sampled according to a regular grid or spacing, or a subset of adjacent subpixels.

Once measurements have been taken of all subpixels in the selected plurality of subpixels, dead or dim EL emitters are detected using the status signals. A subpixel 60 is selected from the selected plurality of subpixels (step 311). A subpixel neighborhood is then selected for the selected EL subpixel, wherein the subpixel neighborhood includes at least two subpixels adjacent to the selected EL subpixel (step 312). The status signal for the selected EL subpixel is compared to the respective status signals of each of the subpixels in the selected subpixel neighborhood to determine whether the selected EL emitter is defective (step 313) as described below. If there are any remaining subpixels in the selected plurality of subpixels, the selected subpixel 60 is de-selected, and another subpixel is selected and compared (decision step 314) to detect other defective EL emitters in the EL display.

Steps 305, 307, 308 and 309 should be performed in that relative order. Steps 311 and 313 should be performed in that relative order.

Referring back to FIGS. 2A and 2B, When measuring multiple EL subpixels 60 simultaneously, e.g. with a parallel/sequential process, steps 307 (turn off current) and 308 (provide test current) are simultaneously performed for a selected number of EL subpixels during a first time period, and step 309 (measure voltage) is performed for each readout line 30 sequentially. For example, current can be applied to subpixels 60*a* and 60*c* simultaneously to produce corresponding voltages on readout lines 30*a* and 30*b* simultaneously. Readout lines 30*a* and 30*b* can be connected to multiplexer 40, which can connect readout line 30*a* to voltage measurement circuit 170 to produce the status signal for subpixel 60*a*, then subsequently connect readout line 30*b* to voltage measurement circuit 170 to produce the status signal for subpixel 60*c*. In this way, multiplexer 40 connected to a plurality of readout lines (e.g. 30*a*, 30*b*) is used to sequentially read out the status signals for a predetermined number of OLED subpixels.

Figure 4:
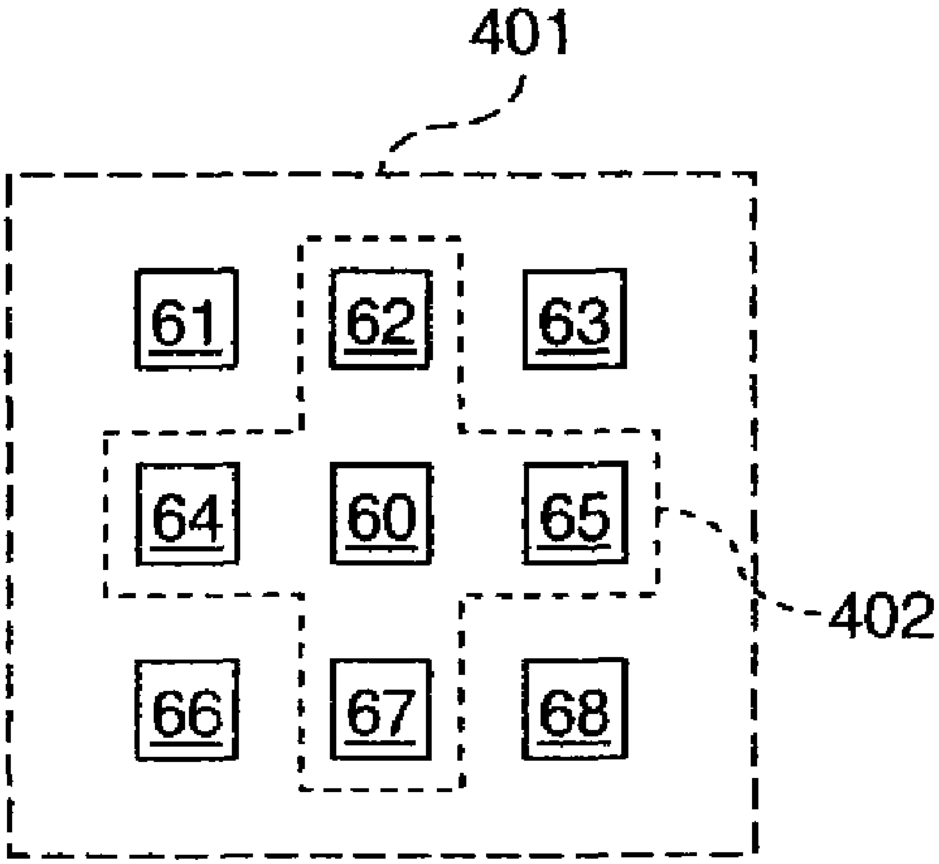
FIG. 4 is a diagram of an exemplary subpixel neighborhood.

FIG. 4 shows an example of a subpixel neighborhood. Subpixel 60 is selected. Subpixel 60 is surrounded by subpixels 61, 62, 63, 64, 65, 66, 67 and 68. In one embodiment, subpixel neighborhood 401 includes all eight surrounding subpixels. In another embodiment, subpixel neighborhood 402 includes a subpixel 62 above the selected EL subpixel, a subpixel 67 below the selected EL subpixel, a subpixel 64 to the left of the selected EL subpixel, and a subpixel 65 to the right of the selected EL subpixel. Using more subpixels in the subpixel neighborhood increases the likelihood of detecting a defective EL emitter and also increases the computation required. Furthermore, using more subpixels in the subpixel neighborhood advantageously reduces sensitivity to defective EL emitters in the subpixel neighborhood.

Figure 5:
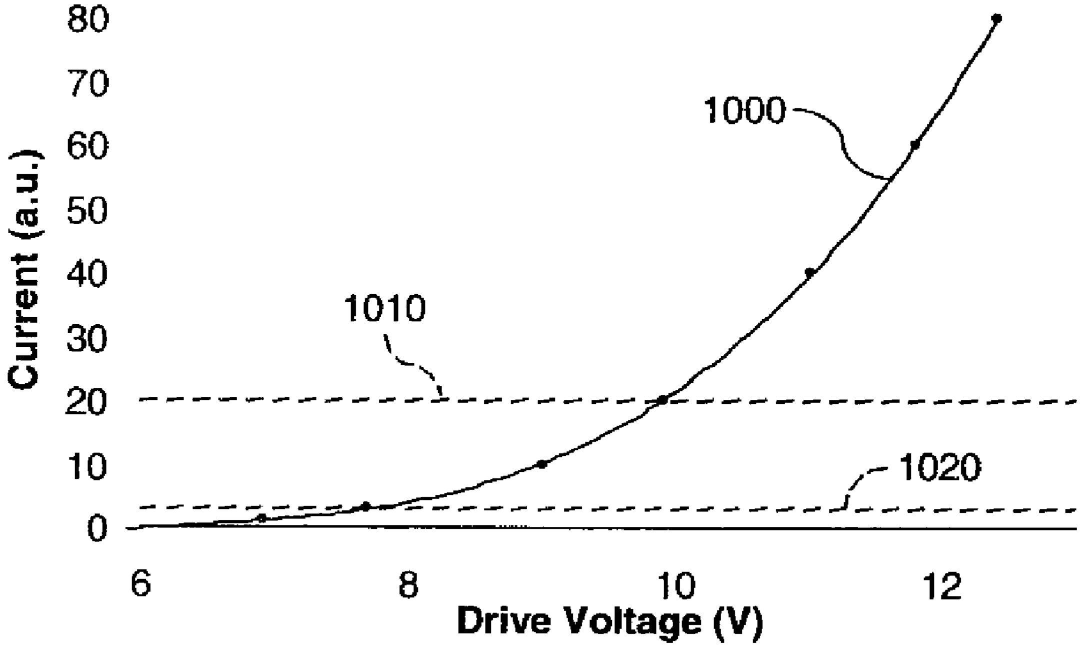
FIG. 5 is an exemplary I-V characteristic of an EL emitter.

FIG. 5 shows an I-V characteristic 1000 of a representative EL emitter 50. The abscissa is drive voltage in volts and the ordinate is current in arbitrary units. Line 1020 is a selected threshold current below which the EL emitter does not emit a significant amount of light. Line 1010 shows an example of a selected test current as used in step 308 of FIG. 3. In this embodiment, the selected test current 1010 is greater than the selected threshold current 1020. This advantageously increases signal-to-noise ratio of the measurements.

The status signal for a selected EL subpixel can be compared to the respective status signals of each of the subpixels in the selected subpixel neighborhood in various ways to determine whether the selected EL emitter is defective. For example, averages, standard deviations, confidence intervals, or other statistical measures can be compared. Table I shows status signals measured from an exemplary display device of the present invention. Subpixels are labeled according to FIG. 4, and defective subpixels are marked with an asterisk ("*"). Subpixel neighborhood 401 was used. Data are shown from four different areas of the display, numbered 1 . . . 4. The "Result" row shows the result $R_1$ of a comparison calculated according to Equation I, where $S_{sn}$, is the status signal of subpixel sn (e.g. $S_{60}$ is the status signal for subpixel 60):

$$R_1=S_{60}/[(S_{61}+S_{62}+S_{63}+S_{64}+S_{65}+S_{66}+S_{67}+S_{68})/8] \quad \text{(Eq. 1)}$$

TABLE 1

| measured data and $R_1$ | | | | |
|---|---|---|---|---|
| Area | 1 | 2 | 3 | 4 |
| No defective subpixels | | | | |
| $R_1$ | 0.999 | 0.986 | 0.985 | 0.992 |
| 61 | 0.2026 | 0.2026 | 0.2075 | 0.2075 |
| 62 | 0.2075 | 0.1978 | 0.2026 | 0.2026 |
| 63 | 0.2148 | 0.1978 | 0.1953 | 0.2002 |
| 64 | 0.2002 | 0.2051 | 0.2075 | 0.21 |
| 60 | 0.2075 | 0.1978 | 0.2002 | 0.2026 |
| 65 | 0.2148 | 0.1978 | 0.1978 | 0.2002 |
| 66 | 0.2002 | 0.2051 | 0.2124 | 0.21 |
| 67 | 0.2075 | 0.2002 | 0.2026 | 0.2026 |
| 68 | 0.2148 | 0.1978 | 0.2002 | 0.2002 |
| Defective selected subpixel | | | | |
| $R_1$ | 1.463 | 1.330 | 2.637 | 2.412 |
| 61 | 0.2075 | 0.2148 | 0.1147 | 0.1112 |
| 62 | 0.2124 | 0.2124 | 0.1025 | 0.1255 |
| 63 | 0.2197 | 0.2075 | 0.1025 | 0.1112 |
| 64 | 0.2051 | 0.2026 | 0.1221 | 0.1231 |
| *60 | 0.3125 | 0.2783 | 0.2905 | 0.2807 |
| 65 | 0.2173 | 0.2075 | 0.105 | 0.1112 |
| 66 | 0.2051 | 0.2026 | 0.1025 | 0.1147 |
| 67 | 0.2246 | 0.2197 | 0.1245 | 0.1085 |
| 68 | 0.2173 | 0.2075 | 0.1074 | 0.1255 |
| Side defective subpixel | | | | |
| $R_1$ | 0.928 | 0.941 | 0.948 | 0.803 |
| 61 | 0.2075 | 0.2051 | 0.2075 | 0.1123 |
| 62 | 0.2124 | 0.2075 | 0.2075 | 0.1123 |

TABLE 1-continued

| measured data and $R_1$ | | | | |
|---|---|---|---|---|
| Area | 1 | 2 | 3 | 4 |
| 63 | 0.2197 | 0.21 | 0.21 | 0.1074 |
| 64 | 0.2222 | 0.2051 | 0.2075 | 0.1074 |
| 60 | 0.2124 | 0.2051 | 0.2051 | 0.105 |
| *65 | 0.3198 | 0.2783 | 0.2539 | 0.2427 |
| 66 | 0.2173 | 0.2051 | 0.2075 | 0.105 |
| 67 | 0.2124 | 0.2075 | 0.2051 | 0.1294 |
| 68 | 0.2197 | 0.2246 | 0.2319 | 0.1294 |
| Corner defective subpixel | | | | |
| $R_1$ | 0.924 | 0.918 | 0.935 | 0.886 |
| 61 | 0.2075 | 0.2197 | 0.21 | 0.2319 |
| 62 | 0.2124 | 0.2173 | 0.21 | 0.2051 |
| *63 | 0.3442 | 0.3589 | 0.3564 | 0.3394 |
| 64 | 0.2051 | 0.2197 | 0.2051 | 0.2148 |
| 60 | 0.2124 | 0.2197 | 0.21 | 0.2026 |
| 65 | 0.2319 | 0.2295 | 0.21 | 0.2075 |
| 66 | 0.2051 | 0.2222 | 0.2075 | 0.2075 |
| 67 | 0.2124 | 0.2246 | 0.1978 | 0.2271 |
| 68 | 0.2197 | 0.2222 | 0.2002 | 0.1953 |

In Table 1, "No defective subpixels" shows that, when no subpixels in the subpixel neighborhood are defective, and the selected subpixel is not defective, $R_1$ is approximately unity. "Defective selected subpixel" shows that, when the selected subpixel 60 is defective, and no subpixels in the subpixel neighborhood are defective, $R_1$ is not approximately unity. "Side defective subpixel" and "Corner defective subpixel" show that, when the selected subpixel 60 is not defective, but one subpixel in the subpixel neighborhood (subpixel 65 for "Side defective subpixel;" subpixel 63 for "Corner defective subpixel") is defective, the present invention is robust against false positives (erroneously reporting a functional subpixel as defective), as $R_1$ is still approximately unity. Therefore, the comparing step can include calculating a first average of the respective status signals of the subpixels in the neighborhood and determining whether the status signal of the selected EL subpixel differs from the first average by more than a selected first percent of the first average. $R_1$ is the ratio of the status signal of the selected EL subpixel to the first average, so an $R_1$ of e.g. less than 0.75 or greater than 1.25 indicates that the status signal of the selected EL subpixel differs from the first average by more than 25% of the first average, and thus that the selected EL subpixel is defective. Values of the first average, and the arrangement and size of the subpixel neighborhood, can be selected to reduce the occurrence of false positives and false negatives (erroneously reporting a defective subpixel as functional) using statistical analyses well-known in the art. As described above, increasing the number of subpixels in the subpixel neighborhood can reduce the probability of occurrence of false negatives, and particularly of false positives.

The likelihood of false positives can be further reduced by using information about defective subpixels to select the subpixel neighborhood for each selected subpixel. Memory 195 (FIG. 2A) can include a defect map for storing information about which EL emitters are defective, and subpixels listed as defective in the defect map can be omitted from any subpixel neighborhood.

Therefore, the respective stored information in the defect map for each subpixel in the subpixel neighborhood will indicate that the subpixel is not defective.

For example, in the "Corner defective subpixel" case, if the defect map indicates subpixel 63 is defective, $R_1'$ can be calculated instead of $R_1$ according to Eq. 2, with the results listed in Table 2, below. $R_1$' is closer to unity than $R_1$, so the probability of a false positive is lower.

$$R_1' = S_{60}/[(S_{61}+S_{62}+S_{64}+S_{65}S_{66}S_{67}+S_{68})/7] \quad \text{(Eq. 2)}$$

TABLE 2

| measured data and $R_1$' | | | | |
|---|---|---|---|---|
| Area | 1 | 2 | 3 | 4 |
| Corner defective pixel, subpixel 63 omitted | | | | |
| $R_1$' | 0.995 | 0.989 | 1.020 | 0.952 |
| $R_1$ | 0.924 | 0.918 | 0.935 | 0.886 |
| 61 | 0.2075 | 0.2197 | 0.21 | 0.2319 |
| 62 | 0.2124 | 0.2173 | 0.21 | 0.2051 |
| *63 | 0.3442 | 0.3589 | 0.3564 | 0.3394 |
| 64 | 0.2051 | 0.2197 | 0.2051 | 0.2148 |
| 60 | 0.2124 | 0.2197 | 0.21 | 0.2026 |
| 65 | 0.2319 | 0.2295 | 0.21 | 0.2075 |
| 66 | 0.2051 | 0.2222 | 0.2075 | 0.2075 |
| 67 | 0.2124 | 0.2246 | 0.1978 | 0.2271 |
| 68 | 0.2197 | 0.2222 | 0.2002 | 0.1953 |

The present invention can be employed with various subpixel structures known in the art. For example, the EL subpixel 60 shown in FIG. 2A is for an N-channel drive transistor and a non-inverted EL structure. The EL emitter 50 is tied to the source electrode of drive transistor 70, higher voltages on the gate electrode of drive transistor 70 command more light output, and voltage supply 140 is more positive than second voltage supply 150, so current flows from 140 to 150, and the selected test current is positive and so flows from first electrode 51 to second electrode 52. However, this invention is applicable to any combination of P- or N-channel transistors and non-inverted (common-cathode) or inverted (common-anode) EL emitters. The appropriate modifications to the circuits for these cases are well-known in the art. For example, in an N-channel inverted configuration, the test current is negative and so flows from second electrode 52 to first electrode 51.

In a preferred embodiment, the invention is employed in a subpixel that includes Organic Light Emitting Diodes (OLEDs) which are composed of small molecule or polymeric OLEDs as disclosed in but not limited to U.S. Pat. No. 4,769,292, by Tang et al., and U.S. Pat. No. 5,061,569, by VanSlyke et al. Many combinations and variations of organic light emitting materials can be used to Fabricate such a panel. Referring to FIG. 2A, when the EL emitter 50 is an OLED emitter, the EL subpixel 60 is an OLED subpixel, and the EL display 10 is an OLED display. This invention also applies to EL emitters other than OLEDs. Although the defect modes of other EL emitter types can be different than the defect modes described herein, the measurement, modeling, and compensation techniques of the present invention can still be applied. The drive transistor 70, and the other transistors (80, 90), can be low-temperature polysilicon (LTPS), zinc oxide (ZnO), or amorphous silicon (a-Si) transistors, or transistors of another type known in the art. On an a-Si backplane, the drive transistor 70 and select transistor 90 are amorphous silicon transistors.

The invention has been described in detail with particular reference to certain preferred embodiments thereof, but it will be understood that variations and modifications can be effected within the spirit and scope of the invention.

PARTS LIST

| | |
|---|---|
| 10 | electroluminescent (EL) display |
| 20, 20a, 20b | select line |
| 30, 30a, 30b | readout line |
| 35 | data line |
| 40 | multiplexer |
| 45 | multiplexer output line |
| 50 | EL emitter |
| 51 | first electrode |
| 52 | second electrode |
| 60-68 | EL subpixel |
| 60a, 60b, 60c, 60d, | EL subpixel |
| 69a, 69b | subpixel group |
| 70 | drive transistor |
| 71 | first electrode |
| 72 | second electrode |
| 73 | gate electrode |
| 75 | capacitor |
| 80 | readout transistor |
| 81 | first electrode |
| 82 | second electrode |
| 83 | gate electrode |
| 90 | select transistor |
| 91 | first electrode |
| 92 | second electrode |
| 93 | gate electrode |
| 95 | control line |
| 110 | first switch |
| 130, 130a, 130b | second switch |
| 131 | connection |
| 132 | connection |
| 140 | first voltage source |
| 150 | second voltage source |
| 155 | source driver |
| 160, 160a, 160b | current source |
| 170 | voltage measurement circuit |
| 180 | low-pass filter |
| 185 | analog-to-digital converter |
| 190 | processor |
| 195 | memory |
| 301-309 | step |
| 310, 314 | decision step |
| 311, 312, 313 | step |
| 401, 402 | subpixel neighborhood |
| 1000 | I-V characteristic |
| 1010 | line |
| 1020 | line |

The invention claimed is:

1. A method of detecting defective electroluminescent (EL) emitters in an EL display, comprising:

a) providing the electroluminescent (EL) display having a plurality of subpixels, each having an EL emitter with a first and a second electrode, a drive transistor with a first electrode, a second electrode connected to the first electrode of the EL emitter, and a gate electrode, and a readout transistor with a first electrode connected to the second electrode of the drive transistor, a second electrode and a gate electrode;

b) providing a first voltage source associated with the first electrode of the drive transistor in each of the plurality of subpixels;

c) providing a second voltage source connected to the second electrode of the EL emitter in each of the plurality of subpixels;

d) providing a current source associated with the second electrode of the readout transistor;

e) selecting an EL subpixel and its corresponding drive transistor, readout transistor and EL emitter;

f) providing a voltage measurement circuit associated with the second electrode of the selected readout transistor;

g) turning off current/low through the selected drive transistor;

h) providing a selected test current through the EL emitter using the current source;

i) measuring the voltage at the second electrode of the selected readout transistor using the voltage measurement circuit to provide a corresponding status signal representative of characteristics of the selected EL emitter;

j) repeating steps e through i for each remaining EL subpixel in the plurality of EL subpixels;

k) selecting an EL subpixel;

l) selecting a subpixel neighborhood for the selected EL subpixel, wherein the subpixel neighborhood includes at least two subpixels adjacent to the selected EL subpixel;

m) comparing the status signal for the selected EL subpixel to the respective status signals of each of the subpixels in the selected subpixel neighborhood to determine whether the selected EL emitter is defective; and n) repeating steps k through m for each remaining EL subpixel in the plurality of EL subpixels to detect other defective EL emitters in the EL display.

2. The method of claim 1, wherein step b includes providing a first switch for selectively connecting the first voltage source to the first electrode of the drive transistor in each of the plurality of sub pixels, and wherein step g includes opening the first switch to turn off current flow through the selected drive transistor.

3. The method of claim 1, wherein the plurality of subpixels is divided into one or more subpixel group(s), and wherein step e includes providing a respective second switch for each of the one or more subpixel group(s) for selectively connecting the current source to the second electrode of the readout transistor in each of the plurality of sub pixels in the respective subpixel group.

4. The method of claim 1, wherein each subpixel neighborhood includes a subpixel above the selected EL subpixel, a subpixel below the selected EL subpixel, a subpixel to the left of the selected EL subpixel, and a subpixel to the right of the selected EL subpixel.

5. The method of claim 1, wherein the comparing step includes calculating a first average of the respective status signals of the subpixels in the neighborhood and determining whether the status signal of the selected EL subpixel differs from the first average by more than a selected first percent of the first average.

6. The method of claim 1, further including providing a defect map for storing information about which EL emitters are defective, and wherein the respective stored information in the defect map for each subpixel in the subpixel neighborhood indicates that the subpixel is not defective.

7. The method of claim 1, wherein the selected test current is greater than a selected threshold current.

8. The method of claim 1, wherein the EL display is an organic light-emitting diode (OLED) display, each EL subpixel is an OLED subpixel, and each EL emitter is an OLED emitter.

9. The method of claim 1, wherein each drive transistor is an amorphous silicon drive transistor.

10. The method of claim 1, wherein the voltage measurement circuit includes an analog-to-digital converter.

11. The method of claim 1, wherein each EL subpixel further includes a select transistor having a second electrode connected to the gate electrode of the drive transistor, and wherein the gate electrode of each select transistor is connected to the gate electrode of the corresponding readout transistor.

12. The method of claim 1, wherein steps g and h are simultaneously performed for a selected number of EL subpixels during a first time period, and wherein step i is sequentially performed for each of the selected number of EL subpixels during the first time period.

13. The method of claim 12, further including arranging the EL subpixels in rows and columns and providing a plurality of select lines corresponding to the rows and a plurality of readout lines corresponding to the columns, wherein each EL subpixel includes a select transistor having a second electrode connected to the gate electrode of the drive transistor, a first electrode and a gate electrode, each select line is connected to the gate electrode(s) of one or more corresponding select transistor(s), and each readout line is connected to the second electrode(s) of one or more corresponding readout transistor (s).

14. The method of claim 13, further including using a multiplexer connected to the plurality of readout lines for sequentially reading out the status signals for the predetermined number of OLED subpixels.

* * * * *